(12) United States Patent
Hasegawa

(10) Patent No.: US 7,732,916 B2
(45) Date of Patent: Jun. 8, 2010

(54) SEMICONDUCTOR PACKAGE

(75) Inventor: Tsuyoshi Hasegawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 164 days.

(21) Appl. No.: 12/030,504

(22) Filed: Feb. 13, 2008

(65) Prior Publication Data

US 2008/0197462 A1 Aug. 21, 2008

(30) Foreign Application Priority Data

Feb. 15, 2007 (JP) ............... 2007-035356

(51) Int. Cl.
*H01L 23/10* (2006.01)
*H01L 23/34* (2006.01)

(52) U.S. Cl. ...................... 257/707; 257/706

(58) Field of Classification Search ................ 257/706, 257/707, 729, 714
See application file for complete search history.

(56) References Cited

U.S. PATENT DOCUMENTS

| | | | |
|---|---|---|---|
| 5,998,240 A | 12/1999 | Hamilton et al. | |
| 6,205,022 B1 | 3/2001 | Bhatia et al. | |
| 6,847,112 B2 * | 1/2005 | Ito | 257/712 |
| 7,081,670 B2 * | 7/2006 | Shibuya et al. | 257/707 |
| 7,154,753 B2 * | 12/2006 | Kobayashi | 361/715 |
| 7,168,152 B1 | 1/2007 | Ehret et al. | |
| 7,190,054 B2 * | 3/2007 | Ishiyama | 257/666 |
| 7,213,338 B2 | 5/2007 | Tonosaki et al. | |
| 7,256,492 B2 * | 8/2007 | Kim | 257/706 |
| 7,352,581 B2 | 4/2008 | Tomioka | |
| 7,449,726 B2 * | 11/2008 | Nakanishi et al. | 257/177 |
| 7,515,415 B2 | 4/2009 | Monfarad et al. | |
| 7,545,033 B2 * | 6/2009 | Grant | 257/706 |
| 2007/0187069 A1 | 8/2007 | Ueno et al. | |
| 2008/0197462 A1 | 8/2008 | Hasegawa | |
| 2008/0286602 A1 | 11/2008 | Hasegawa | |
| 2009/0008770 A1 | 1/2009 | Hasegawa | |
| 2009/0039500 A1 | 2/2009 | Ito et al. | |

(Continued)

FOREIGN PATENT DOCUMENTS

JP     2001-144237     5/2001

(Continued)

OTHER PUBLICATIONS

U.S. Appl. No. 12/533,494, filed Jul. 31, 2009, Hasegawa.

(Continued)

*Primary Examiner*—S. V Clark
(74) *Attorney, Agent, or Firm*—Oblon, Spivak, McClelland, Maier & Neustadt, L.L.P.

(57) ABSTRACT

A semiconductor package is provided with a package main body including a base portion configured by joining thin plates integrally, and a semiconductor device accommodating portion provided on one surface of the base portion, electric terminals electrically connected to a semiconductor device in the accommodating portion and exposed to an outer surface of the accommodating portion, and a heat high-transfer element including at least one layer-like member provided in the base portion. The layer-like member is configured independent of the base portion by a material having a thermal conductivity higher than that of the base portion, and extends from a position corresponding to a heat-generation site of the semiconductor device to a position in an outside of the heat-generation site corresponding position.

5 Claims, 3 Drawing Sheets

U.S. PATENT DOCUMENTS

2009/0091891 A1    4/2009    Hasegawa
2009/0205806 A1    8/2009    Hasegawa

FOREIGN PATENT DOCUMENTS

| | | |
|---|---|---|
| JP | 2003-37196 | 2/2003 |
| JP | 2004-28557 | 1/2004 |
| JP | 2004-249589 | 9/2004 |
| JP | 2004-288949 | 10/2004 |
| JP | 2005-175006 | 6/2005 |
| JP | 2005-236276 | 9/2005 |
| JP | 2006-13420 | 1/2006 |
| JP | 2006-32798 | 2/2006 |

OTHER PUBLICATIONS

U.S. Appl. No. 12/579,023, filed Oct. 14, 2009, Takagi et al.

* cited by examiner

SEMICONDUCTOR PACKAGE

CROSS-REFERENCE TO RELATED APPLICATIONS

This application is based upon and claims the benefit of priority from prior Japanese Patent Application No. 2007-035356, filed Feb. 15, 2007, the entire contents of which are incorporated herein by reference.

BACKGROUND OF THE INVENTION

1. Field of the Invention

This invention relates to a semiconductor package accommodating a semiconductor device therein.

2. Description of the Related Art

A semiconductor package comprising a package main body including a base portion having a first surface and a second surface on the side opposite to the first surface, and a semiconductor device accommodating portion provided on the first surface and accommodating a semiconductor device therein; and electric terminals provided in the semiconductor device accommodating portion, electrically connected to the semiconductor device, and exposed on an outer surface of the semiconductor device accommodating portion, has been conventionally known.

A semiconductor device is formed by mounting a desired circuit pattern on a surface of a substrate made from substrate material which is usually silicon, and generates a large amount of heat from the circuit pattern during its operation. When a temperature of the circuit pattern exceeds a certain temperature, the circuit pattern cannot work with its desired performance.

In the conventional semiconductor package, at least the base portion of the package main body is made from material with a high thermal conductivity, for example, copper, aluminum, copper alloy, or aluminum alloy, in order to radiate the heat generated by the semiconductor device. Heat generated by the semiconductor device accommodated in the semiconductor device accommodating portion is transferred to the package main body, mainly to the base portion, and it is further radiated to a material which is in contact with the package main body, mainly with the base portion, for example, a semiconductor package supporting member on which the base portion is placed, air surrounding the package main body, and the other materials.

In recent years where high integration of a circuit pattern mounted on a semiconductor device advances and heat quantity generated by the semiconductor device increases, various structures for improving a heat transfer efficiency of the semiconductor package have been proposed.

JP-A-2004-288949 discloses one example of a structure for improving a heat transfer efficiency as described above. In a semiconductor package disclosed in JP-A-2004-288949, a graphite sheet is brought in close contact with a second surface of a base portion of a package main body. Since the graphite sheet has a high thermal conductivity, heat transferred from the second surface of the base portion of the package main body is diffused rapidly in a direction extending along the second surface, so that a heat transfer efficiency from the base portion of the package main body to a material neighboring thereto is involved.

JP-A-2001-144237 discloses another example of the structure for improving a heat transfer efficiency as described above. In the structure for improving a heat transfer efficiency, a plurality of graphite sheets and a plurality of metal thin plates are laminated alternately. The metal thin plate increases a transfer amount of heat due to its large thermal capacity and the graphite sheet improves heat radiation from the metal thin plate due to its large thermal conductivity.

In the structure for improving a heat transfer efficiency described in JP-A-2004-288949, the graphite sheet is sandwiched between the second surface of the base portion and a predetermined position on a surface of a semiconductor package supporting body when the base portion of the package main body of the semiconductor package is fixed to the predetermined position on the surface of the semiconductor package supporting body by screws, so that the graphite sheet is brought in close contact with the second surface of the base portion and the predetermined position on the surface of the semiconductor package supporting body.

In the fixation utilizing screws as described above, however, uniformity of the degree of the close contact of the graphite sheet to the second surface of the base portion of the package main body of the semiconductor package and the predetermined position on the surface of the semiconductor package supporting body becomes impaired easily. That is, the heat transfer efficiency from the second surface of the base portion to the predetermined position on the surface of the semiconductor package supporting body becomes uneven easily on these surfaces. In addition, the heat transfer efficiency of the graphite sheet in its thickness direction is smaller than that of the graphite sheet in a direction along its surface.

Accordingly, the structure for improving a heat transfer efficiency described in JP-A-2004-288949 can not perform sufficient cooling effect to an increase in heat quantity generated by a semiconductor device in recent years.

In the structure for improving a heat transfer efficiency described in JP-A-2001-144237, the plurality of graphite sheets and the plurality of metal thin plates laminated alternately are mutually brought in close contact with each other using screws, a bonding agent or an adhesive agent to be fixed to each other.

The structure for improving a heat transfer efficiency described in JP-A-2001-144237 is improved in heat radiating efficiency due to an increase in the number of graphite sheets used and the use of the plurality of metal thin plates as compared with that described in JP-A-2004-288949. However, since the alternately laminated graphite sheets and metal thin plates are fixed each other by the screws, the bonding agent or the adhesive agent as described above, the uniformity of the degree of the mutual close contact between the plurality of graphite sheets and the plurality of metal thin plates becomes impaired easily. That is, the mutual heat transfer efficiency between the plurality of graphite sheets and the plurality of metal thin plates becomes nonuniform easily. In addition, the heat transfer efficiency of the graphite sheet in its thickness direction is smaller than that of the graphite sheet in a direction along its surface.

Accordingly, even in the structure for improving a heat transfer efficiency described in JP-A-2004-288949, it can not perform a sufficient cooling effect to the increase of the heat quantity generated by a semiconductor device in recent years. Further, since the alternately laminated graphite sheets and metal thin plates fixed each other by the screws, the bonding agent or the adhesive agent as described above have a relatively large thickness, the thickness of the structure for improving a heat transfer efficiency described above becomes relatively large.

BRIEF SUMMARY OF THE INVENTION

According to one aspect of the present invention, a semiconductor package comprises: a package main body including a base portion which has a first surface and a second surface on a side opposite to the first surface and which is configured by bringing a plurality of thin plates in close contact with each other to join the plates integrally, and a semiconductor device accommodating portion which is provided on the first surface and which accommodates a semiconductor device therein; electric terminals which are provided in the semiconductor device accommodating portion, which are electrically connected to the semiconductor device, and which are exposed to an outer surface of the semiconductor device accommodating portion; and a heat high-transfer element including at least one layer-like member which is provided in the base portion, which is configured independent of the base portion by a material having a thermal conductivity higher than that of the base portion, which is disposed in the base portion so as to extend from a position corresponding to a heat-generation site of the semiconductor device to a position in an outside of the heat-generation site corresponding position, and which transfers a heat generated at the heat-generation site of the semiconductor device from the heat-generation site corresponding position to the outside position in the base portion.

BRIEF DESCRIPTION OF THE SEVERAL VIEWS OF THE DRAWINGS

The accompanying drawings, which are incorporated in and constitute a part of the specification, illustrate a embodiment of the invention, and together with the general description given above and the detailed description of the embodiments given below, serve to explain the principles of the invention.

DETAILED DESCRIPTION OF THE INVENTION

Figure 1:
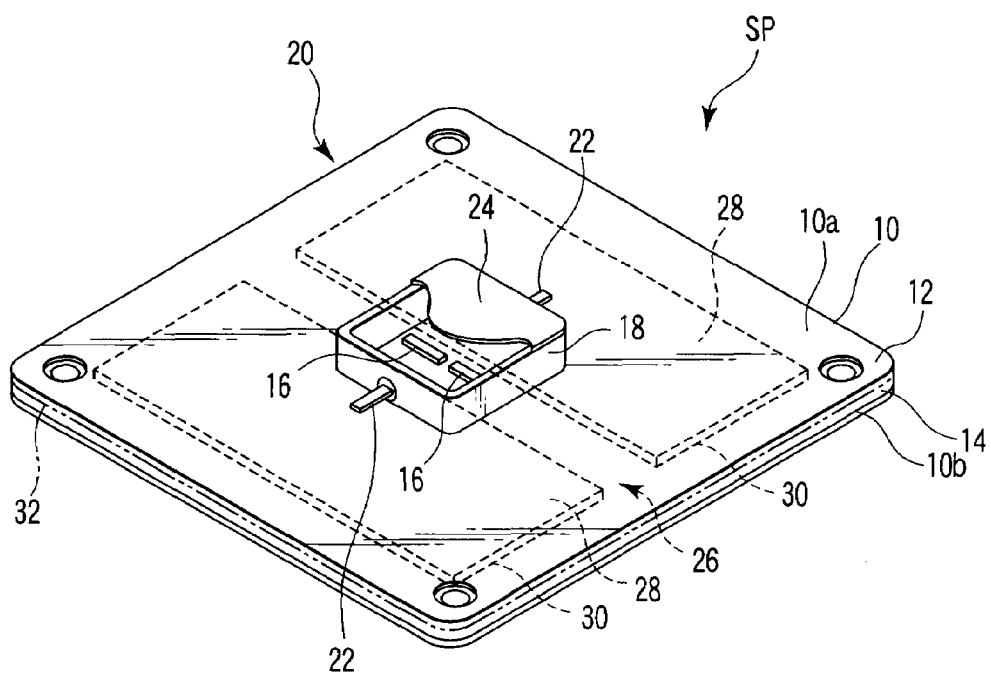
FIG. 1 is a schematic perspective view showing a semiconductor package according to an embodiment of the present invention, where a lid of a semiconductor device accommodating portion of a package main body is partially cut out.

A semiconductor package SP according to an embodiment of the present invention will be explained below with reference to FIG. 1 to FIG. 3.

The semiconductor package SP according to the embodiment is provided with a package main body 20 including a base portion 10 which has a first surface 10a and a second surface 10b on a side opposite to the first surface 10a and which is configured by bringing a plurality of thin plates 12, 14 in close contact with each other to integrally joining them (for example, a diffusion joining), and a semiconductor device accommodating portion 18 which is provided on the first surface 10a and which accommodates semiconductor devices 16 therein.

The semiconductor device accommodating portion 18 is provided with electric terminals 22 electrically connected to the semiconductor devices 16 accommodated in the semiconductor device accommodating portion 18, and the electric terminals 22 are exposed to an outer surface of the semiconductor device accommodating portion 18. In this embodiment, as shown in FIGS. 2 and 3, mounting circuit substrates 23 on which peripheral circuits for the semiconductor devices 16 are mounted are further accommodated in the semiconductor device accommodating portion 18, and the semiconductor devices 16 are electrically connected the electric terminals 22 through wirings on the mounting circuit substrates 23. The mounting circuit substrates 23 are not shown in FIG. 1 to clear FIG. 1.

Specifically, the plurality of thin plates 12, 14 are made of metal material with a high thermal conductivity (for example, including copper, aluminum, copper alloy, aluminum alloy, or metal material having a thermal conductivity which is substantially the same as those of these materials, where the thermal conductivity of copper is about 400 W/mk). In FIG. 1 and FIG. 3, only two thin plates 12, 14 are shown, but the number of thin plates to be brought in close contact with each other and to be joined integrally to configure the base portion 10 may be three or more according to an aspect of the present invention.

The semiconductor device accommodating portion 18 has a tubular shape for providing an internal space in which the semiconductor devices 16 and the mounting circuit substrates 23 on which peripheral circuits for the semiconductor devices 16 are accommodated, and the accommodating portion 18 surrounds a predetermined region on the first surface 10a of the base portion 10. The semiconductor devices 16 and the mounting circuit substrates 23 are placed on the predetermined region on the first surface 10a. The semiconductor device accommodating portion 18 includes a lid 24 covering an opening opposite to the predetermined region of the first surface 10a of the base portion 10. The lid 24 closes the opening to seal the internal space from an external space after the semiconductor devices 16 and the mounting circuit substrates 23 are placed on the predetermined region of the first surface 10a and electrical connections between the semiconductor devices 16 and the mounting circuit substrates 23 and the electrical terminals 22 are finished.

In this embodiment, in order to increase a heat-radiating function of the base portion 10 of the package main body 20, a ratio of the surface areas of the first surface 10a and the second surface 10b of the base portion 10 to the semiconductor device accommodating portion 18 in the package main body 20 is set large.

A heat high-transfer element 26 is provided in the base portion 10. The heat high-transfer element 26 has a heat conductivity higher than that of the base portion 10 and extends from heat-generation site corresponding positions, which corresponds to heat-generation sites of the semiconductor devices 16 accommodated in the semiconductor device accommodating portion 18, to an outside position, which is positioned in an outside of the heat-generation site corresponding positions, in the base portion 10. In this embodiment, the heat-generation site corresponding positions are neighbored to the heat-generation sites of the semiconductor devices 16 on the first surface 10a of the base portion 10. The heat high-transfer element 26 transfers the heat generated from the heat-generation sites of the semiconductor devices 16 rapidly from the heat generating site correspondence positions to the outside position in the base portion 20.

The heat high-transfer element 26 includes at least one layer-like member 28 which is independent of the base portion 10, which is made of a material having a thermal conductivity higher than that of the base portion 10 to be independent from the base portion 10 and which extends from the heat-generation site correspondence positions to the outside position in the base portion 10.

In this embodiment, the layer-like member 28 is configured by a graphite sheet (thermal conductivity: 1500 W/mK).

The plurality of thin plates 12, 14 of the base portion 10 have openings 30 with a shape corresponding to the layer-like member 28. The thin plates 12, 14 are brought in close contact with each other in a state that their openings 30 are superimposed on each other, and the thin plates 12, 14 are integrally joined (for example, diffusion joining) with each other.

Since the layer-like member 28 is disposed in the openings 30 with the shape corresponding to the layer-like member 28 in the plurality of thin plates 12, 14 of the base portion 10 and the plurality of thin plates 12, 14 are brought in close contact with each other in the state that their openings 30 are superimposed on each other to join integrally with each other, the layer-like member 28 in the openings 30 of the plurality of thin plates 12, 14 is brought in close contact with inner surfaces of the openings 30 reliably.

Since the layer-like member 28 of the heat high-transfer element 26 in the openings 30 of the plurality of thin plates 12, 14 of the base portion 10 is brought in close contact with the inner surfaces of the openings 30 reliably and uniformly in addition to expansion of the surface areas of the first surface 10a and the second surface 10b of the base portion 10, a heat-radiating function of the base portion 10 is largely increased. Further, the reliable and uniform close contact can be achieved easily by bringing the plurality of thin plates 12, 14 in close contact with each other in the state that the openings 30 of the thin plates 12, 14 are superimposed on each other and by integrally joining the thin plates 12, 14 with each other. By bringing the plurality of thin plates 12, 14 including the layer-like member 28 in their openings 30 in close contact with each other and by integrally joining the thin plates 12, 14 with each other to configure the base portion 10, the thickness of the base portion 10 can be made thin.

The layer-like member 28 may have an arbitrary shape. Further, an arbitrary number of the layer-like members 28 can be arranged arbitrarily in the base portion 10. That is, the heat can be rapidly and effectively transferred from the heat-generation site corresponding positions to a desired outside position on the base portion 10.

Due to a difference between the thermal expansion coefficient of a substrate (generally, made of silicon) of the semiconductor device 16 or that of the mounting circuit substrate (generally, made of ceramic) 23 and the thermal expansion coefficient of the specified region of the base portion 10 surrounded by the semiconductor device accommodating portion 18 and covered by the substrates, a possibility that a crack or a break occurs in the substrate of the semiconductor device 16 or in the mounting circuit substrate (generally, made of ceramic) 23 or in the both substrates becomes large in accordance with an increase in the calorific value of the heat generated by the semiconductor device 16.

In order to prevent such occurrence of a crack or a break in the substrate of the semiconductor device 16 or in the mounting circuit substrate (generally, made of ceramic) 23 or in the both substrates, at least one thin plate 32 having a thermal expansion coefficient which is equal to or smaller than that of the substrate of the semiconductor device 16 or that of the mounting circuit substrate (generally, made of ceramic) 23 can be included in the plurality of thin plates configuring the base plate 10. As a material for such a thin plate 32, for example, molybdenum is known.

The thickness or the shape of such a thin plate 32 or arrangement of the thin plate 32 in the base portion 10 is set to prevent the occurrence of the crack or the break in the substrate of the semiconductor device 16 or in mounting circuit substrate 23 or in the both substrates due to the difference in the thermal expansion coefficient and to prevent a deterioration in a desired heat-transfer function of the base portion 10.

Next, a modification of the semiconductor package SP according to the embodiment and shown in FIG. 1 to FIG. 3 will be explained with reference to FIG. 4.

Figure 2:
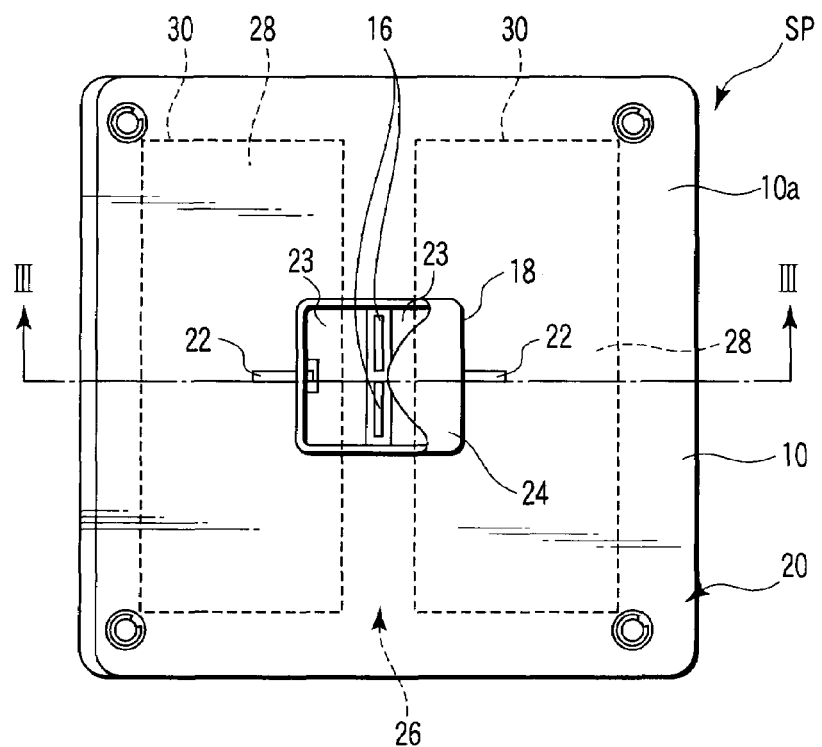
FIG. 2 is a schematic plan view of the semiconductor package shown in FIG. 1.
Figure 3:
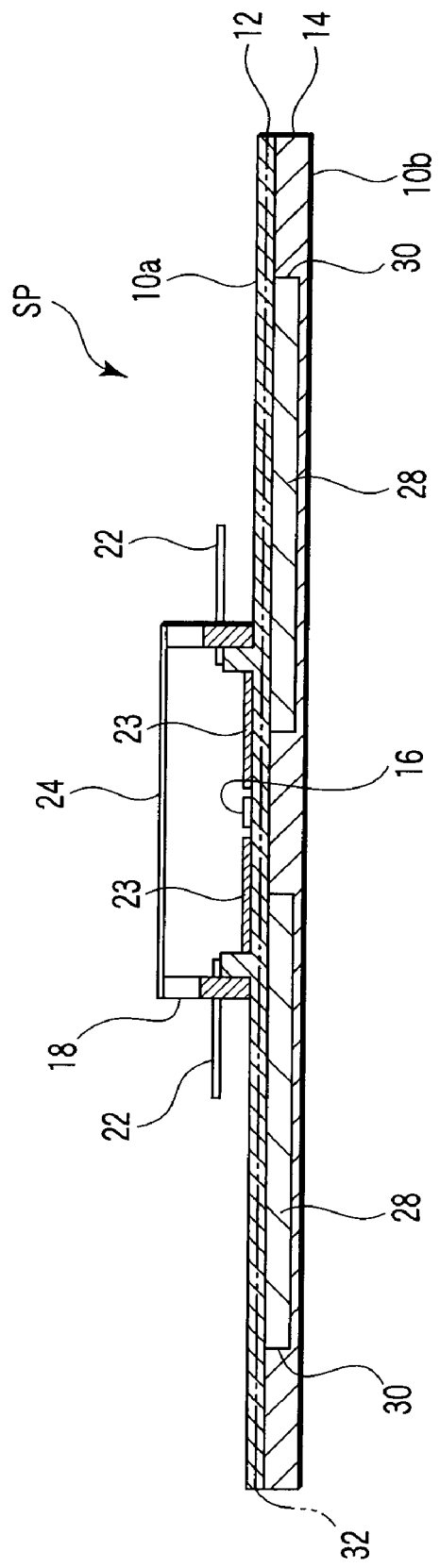
FIG. 3 is a schematic vertical sectional view taken along a line III-III in FIG. 2.

Most part of structural members of a semiconductor package SP' according to the modification is the same as that of the semiconductor package SP according to the embodiment and shown in FIG. 1 to FIG. 3. Therefore, the structural members of the semiconductor package SP' according to the modification, which are correspond to those of the semiconductor package SP according to the embodiment, are designated by the same reference numerals which designate the structural members of the semiconductor package SP of the embodiment corresponding those of the semiconductor package SP' of the modification, and detailed explanations thereto will be omitted.

In the semiconductor package SP according to the embodiment and shown in FIG. 1 to FIG. 3, in order to increase the heat-radiating function of the base portion 10 of the package main body 20, the ratio of the surface areas of the first surface 10a and the second surface 10b of the base portion 10 to the semiconductor device accommodating portion 18 in the package main body 20 is set large. But, a calorific value of a heat generated by a semiconductor device 16' accommodated in the semiconductor device accommodating portion 18 in the modified semiconductor package SP' is greatly smaller than that of the heat generated by the semiconductor device 16 used in the above described semiconductor package SP according to the embodiment.

Figure 4:
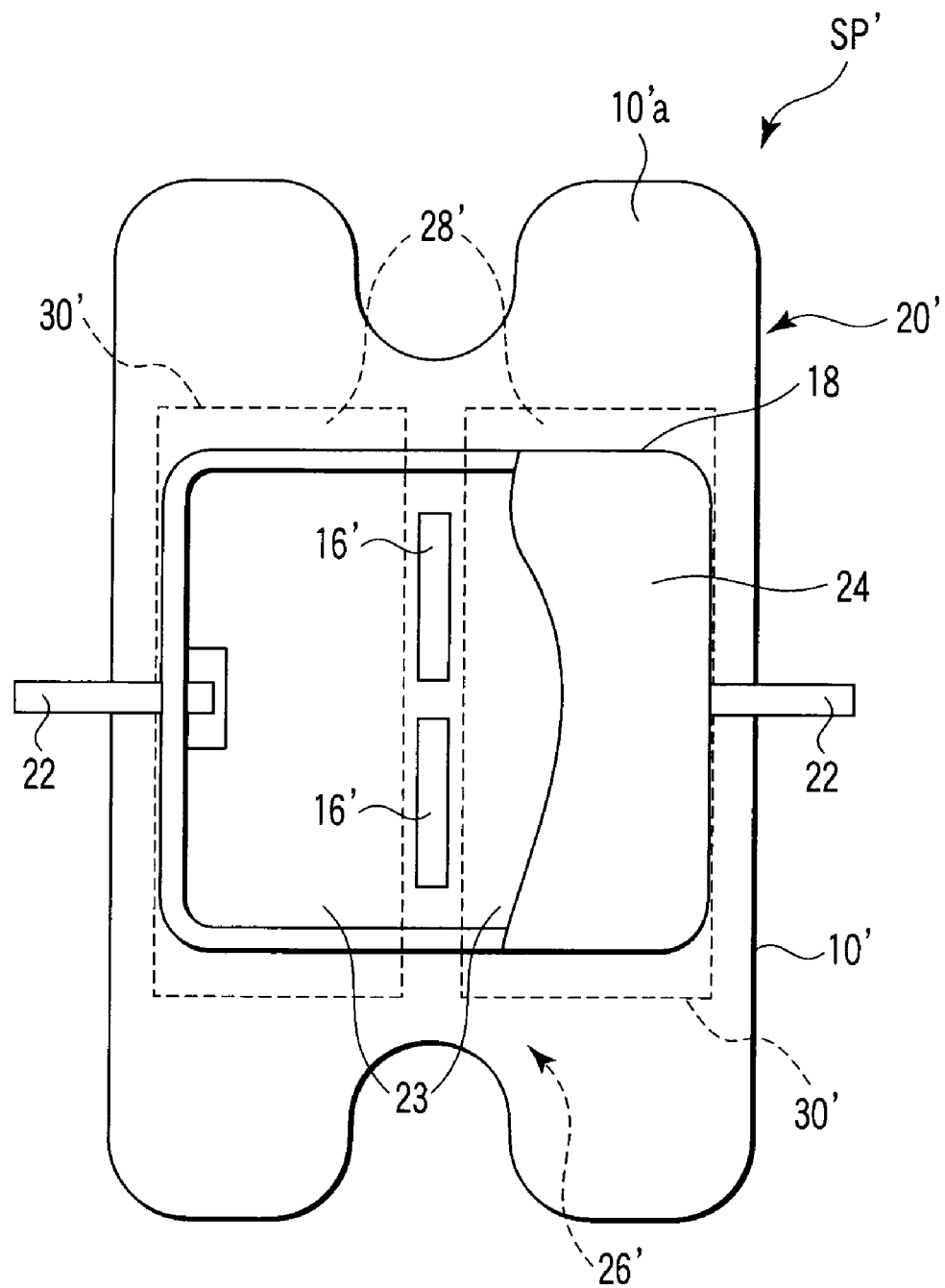
FIG. 4 is a schematic plan view of a modification of the semiconductor package shown in FIG. 1.

Therefore, in the modified semiconductor package SP' shown in FIG. 4, the ratio of the surface areas of the first surface 10'a and the second surface (which is opposite to the first surface 10'a in FIG. 4 and which is not shown in FIG. 4) of the base portion 10' to the semiconductor device accommodating portion 18 in the package main body 20' is set very small.

And, as a result of this, a plain area of each of the opening 30' formed in the base portion 10' to accommodate the layer-like member 28' of the heat high-transfer element 26' and the layer-like member 28' accommodated in the opening 30' is set to be very smaller than that of each of the opening 30 formed in the base portion 10 of the above described semiconductor package SP according to the embodiment to accommodate the layer-like member 28 of the heat high-transfer element 26 and the layer-like member 28 accommodated in the opening 30.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor package comprising:
   a package main body including a base portion which has a first surface and a second surface on a side opposite to the first surface and which is configured by bringing a plurality of thin plates in close contact with each other to join the plates integrally, and a semiconductor device accommodating portion which is provided on the first surface and which accommodates a semiconductor device therein;

electric terminals which are provided in the semiconductor device accommodating portion, which are electrically connected to the semiconductor device, and which are exposed to an outer surface of the semiconductor device accommodating portion; and a heat high-transfer element including at least one layer-like member which is provided in the base portion, which is configured independent of the base portion by a material having a thermal conductivity higher than that of the base portion, which is disposed in the base portion so as to extend from a position corresponding to a heat-generation site of the semiconductor device to a position in an outside of the heat-generation site corresponding position, and which transfers a heat generated at the heat-generation site of the semiconductor device from the heat-generation site corresponding position to the outside position in the base portion.

2. The semiconductor package according to claim 1, wherein the plurality of thin plates in the base portion have openings with shapes corresponding to the layer-like member, and the thin plates are joined integrally with each other while the thin plates are brought in close contact with each other in a state that the respective openings are superimposed on each other.

3. The semiconductor package according to claim 1, wherein the plurality of thin plates in the base portion includes at least one thin plate having a thermal expansion coefficient equal to or smaller than that of a substrate of the semiconductor device.

4. The semiconductor package according to claim 1, wherein the layer-like member of the heat high-transfer element includes a graphite sheet.

5. The semiconductor package according to claim 1, further comprising a mounting circuit substrate on which peripheral circuits for the semiconductor device are mounted and which is accommodated in the semiconductor device accommodating portion, and wherein the plurality of thin plates in the base portion includes at least one thin plate having a thermal expansion coefficient equal to or smaller than that of a substrate of the semiconductor device or that of the mounting circuit substrate.

* * * * *